US012603473B2

(12) United States Patent (10) Patent No.: US 12,603,473 B2
Horn et al. (45) Date of Patent: Apr. 14, 2026

(54) METHOD FOR PRODUCING A SEMI-CONDUCTOR LASER ARRANGEMENT, AND SEMI-CONDUCTOR LASER ARRANGEMENT

(71) Applicant: ams-OSRAM International GmbH, Regensburg (DE)

(72) Inventors: Markus Reinhard Horn, Bayerbach bei Ergoldsbach (DE); Jörg Erich Sorg, Regensburg (DE); Harald König, Bernhardswald (DE)

(73) Assignee: AMS-OSRAM INTERNATIONAL GMBH, Regensburg (DE)

( * ) Notice: Subject to any disclaimer, the term of this patent is extended or adjusted under 35 U.S.C. 154(b) by 701 days.

(21) Appl. No.: 17/920,160

(22) PCT Filed: Apr. 20, 2021

(86) PCT No.: PCT/EP2021/060234
§ 371 (c)(1),
(2) Date: Oct. 20, 2022

(87) PCT Pub. No.: WO2021/219441
PCT Pub. Date: Nov. 4, 2021

(65) Prior Publication Data
US 2023/0170667 A1 Jun. 1, 2023

(30) Foreign Application Priority Data
Apr. 27, 2020 (DE) ..................... 10 2020 111 394.3

(51) Int. Cl.
*H01S 5/0237* (2021.01)
*H01S 5/02325* (2021.01)
(Continued)

(52) U.S. Cl.
CPC ........ *H01S 5/0237* (2021.01); *H01S 5/02325* (2021.01); *H01S 5/02476* (2013.01); *H01S 5/4031* (2013.01); *H01S 5/4093* (2013.01)

(58) Field of Classification Search
CPC .... H01S 5/023; H01S 5/0237; H01S 5/02325; H01S 5/02365; H01S 5/4031; H01S 5/4093; H01S 5/02476
See application file for complete search history.

(56) References Cited

U.S. PATENT DOCUMENTS 6,229,831 B1 * 5/2001 Nightingale ......... G02B 6/4249
                                                 372/109
2004/0208209 A1 * 10/2004 Okazaki ............... H01S 5/4031
                                                 372/36
(Continued)

FOREIGN PATENT DOCUMENTS

DE    102009047791 A1    3/2011
DE    102015116092 A1    3/2017
(Continued)

OTHER PUBLICATIONS

Japanese Notification of Reasons for Refusal issued in Japanese Application No. 2022-565646 dated Aug. 8, 2023, with English language translation, 9 pages.
(Continued)

*Primary Examiner* — James A Menefee
(74) *Attorney, Agent, or Firm* — MH2 Technology Law Group LLP

(57) ABSTRACT

The invention relates to a method for producing a semi-conductor laser arrangement (1), in which a first laser diode chip (21) is arranged on a first intermediate support (31). A second laser diode chip (22) is arranged on a second intermediate support (32). The second laser diode chip (22) with the second intermediate support (32) is arranged on the first intermediate support (31), the second intermediate
(Continued)

support (32) being arranged on a side of the second laser diode chip (22) facing away from the first intermediate support (31). The invention furthermore relates to a semiconductor arrangement (1).

16 Claims, 5 Drawing Sheets

(51) Int. Cl.
  *H01S 5/024* (2006.01)
  *H01S 5/40* (2006.01)

(56) References Cited

U.S. PATENT DOCUMENTS

| | | | |
|---|---|---|---|
| 2008/0317082 A1* | 12/2008 | Inenaga | H01S 5/023 |
| | | | 372/50.12 |
| 2009/0080485 A1 | 3/2009 | Yamasaki et al. | |
| 2009/0147816 A1* | 6/2009 | Iga | H01S 5/22 |
| | | | 372/50.12 |
| 2011/0007771 A1* | 1/2011 | Bessho | B82Y 20/00 |
| | | | 372/44.01 |
| 2011/0051773 A1* | 3/2011 | Tanikawa | H01S 5/4031 |
| | | | 372/50.12 |
| 2011/0188532 A1* | 8/2011 | Hata | H01S 5/02375 |
| | | | 372/50.12 |
| 2012/0027040 A1* | 2/2012 | Hata | H01S 5/02345 |
| | | | 372/50.1 |
| 2012/0106584 A1* | 5/2012 | Katsuki | H01S 5/4031 |
| | | | 372/50.12 |
| 2016/0372893 A1 | 12/2016 | McLaurin et al. | |
| 2018/0226772 A1* | 8/2018 | Ikeda | H01S 5/0237 |
| 2018/0269650 A1 | 9/2018 | Nozaki | |
| 2020/0185879 A1 | 6/2020 | Nozaki | |

FOREIGN PATENT DOCUMENTS

| | | |
|---|---|---|
| DE | 102017103884 A1 | 8/2018 |
| JP | 200976730 A | 10/2010 |
| JP | 2011165708 A | 8/2011 |
| WO | 2017098689 A1 | 10/2018 |

OTHER PUBLICATIONS

Hervé, Denis, International Search Report (with English Translation) and Written Opinion in corresponding International Application No. PCT/EP2021/060234 mailed on Jul. 21, 2021, 15 pages.
Japanese Final Notification of Reasons for Refusal issued in Japanese Application No. 2022-565646 dated Jan. 15, 2024, with English language translation, 6 pages.
German Office Action issued in corresponding German Patent Application No. 11 2021 002 600.3 dated Jul. 29, 2025, with English language translation, 12 pages.

\* cited by examiner

METHOD FOR PRODUCING A SEMI-CONDUCTOR LASER ARRANGEMENT, AND SEMI-CONDUCTOR LASER ARRANGEMENT

CROSS-REFERENCE TO RELATED APPLICATIONS

The present application is a national stage entry from International Application No. PCT/EP2021/060234, filed on Apr. 20, 2021, published as International Publication No. WO 2021/219441 A1 on Nov. 4, 2021, and claims priority to German Patent Application DE102020111394.3 filed Apr. 27, 2020, the disclosures of all of which are hereby incorporated by reference herein in their entireties.

FIELD OF THE INVENTION

The present application relates to a method for producing a semiconductor laser arrangement and a semiconductor laser arrangement.

BACKGROUND OF THE INVENTION

Laser light sources are in demand for various applications, in which multiple emitters, which emit in particular in different spectral ranges, are arranged adjacent to one another at a small distance. The failure of a single emitter typically has the result that the entire device is unusable, due to which the emitters which are functional as such are ultimately also unusable.

One object is to specify a simple, cost-effective, and reliable production of laser components having multiple emitters.

This object is achieved, inter alia, by a method and a semiconductor laser arrangement according to the independent claims. Further embodiments and expedient features are the subject matter of the dependent claims.

A method is specified for producing a semiconductor laser arrangement.

SUMMARY OF THE INVENTION

According to at least one embodiment of the method, the method comprises a step in which a first laser diode chip is arranged on a first intermediate carrier. For example, the first laser diode chip is fastened using a connecting layer, such as a solder layer, directly on the intermediate carrier. Preferably, only the connecting layer is located between the first laser diode chip and the first intermediate carrier.

The first laser diode chip has, for example, a semiconductor body having an active region provided for radiation generation and a substrate. The semiconductor body has, for example, a semiconductor layer sequence, which is deposited epitaxially in particular, having the active region. The substrate can be a growth substrate for depositing the semiconductor layers of the semiconductor body or a substrate different from the growth substrate. The substrate is used to mechanically stabilize the semiconductor body and expediently has a greater thickness, thus a greater extension perpendicular to the main extension plane of the semiconductor layers of the semiconductor body, than the semiconductor body, for example, a thickness at least twice as large or at least five times as large. In particular, the substrate is the element of the first laser diode chip having the greatest thickness.

The first intermediate carrier (also referred to as a submount) is used in particular for heat dissipation or heat spreading of the waste heat arising in operation of the laser diode chip. The first intermediate carrier is preferably formed by a material having a high thermal conductivity, for example having a thermal conductivity of at least 100 W/(m*K). For example, the first intermediate carrier contains AlN, SiC, CuW. Other materials can also be used, for example molybdenum or diamond like carbon (DLC). The first intermediate carrier can be electrically conductive or electrically insulating. For example, electrical connection surfaces are formed electrically isolated from one another on a mounting side of the first intermediate carrier. The first intermediate carrier can also be multilayered. For example, the first intermediate carrier has an insulating layer for electrical isolation of one or more electrical connection surfaces from the remaining, for example, electrically conductive part of the first intermediate carrier.

For example, the first laser diode chip is fastened on the first intermediate carrier so that the semiconductor body is arranged having the active region on the side of the substrate facing toward the first intermediate carrier. The substrate is thus not located between the active region and the first intermediate carrier, so that in the case of a substrate a having comparatively low thermal conductivity, efficient heat dissipation can take place out of the semiconductor body.

According to at least one embodiment of the method, the method comprises a step in which a second laser diode chip is arranged on a second intermediate carrier. For example, the second laser diode chip is fastened using a connecting layer, such as a solder layer, directly on the second intermediate carrier. Preferably, only the connecting layer is located between the second laser diode chip and the second intermediate carrier.

As described in conjunction with the first laser diode chip, the second laser diode chip can have a semiconductor body having an active region provided for generating radiation and a substrate. The active regions of the first laser diode chip and the second laser diode chip are preferably configured, however, for generating radiation having peak wavelengths different from one another, in particular in spectral ranges different from one another. Furthermore, the active regions have material compositions different from one another and can also be different from one another with respect to the material system used.

The second intermediate carrier can have one or more of the features listed in conjunction with the first intermediate carrier with respect to its structure.

The second laser diode chip can be arranged on the second intermediate carrier so that the semiconductor body is arranged having the active region on the side of the substrate facing away from the second intermediate carrier.

According to at least one embodiment of the method, the method comprises a step in which the second laser diode chip is arranged having the second intermediate carrier on the first intermediate carrier and in particular is fastened thereon, for example by means of a connecting layer. Preferably, only the connecting layer is located between the second laser diode chip and the first intermediate carrier.

Upon the arrangement of the second laser diode chip on the first intermediate carrier, the second intermediate carrier is preferably arranged on a side of the second laser diode chip facing away from the first intermediate carrier. The second laser diode chip is thus located, seen in a side view of the semiconductor laser arrangement, between the first intermediate carrier and the second intermediate carrier in the vertical direction, thus perpendicularly to the mounting side of the first intermediate carrier.

The semiconductor laser arrangement to be produced can also have more than two laser diode chips. The number of the intermediate carriers preferably corresponds to the number of the laser diode chips present in the semiconductor laser arrangement to be produced.

In at least one embodiment of the method, a first laser diode chip is arranged on a first intermediate carrier. A second laser diode chip is arranged on a second intermediate carrier. The second laser diode chip having the second intermediate carrier is arranged on the first intermediate carrier, wherein the second intermediate carrier is arranged on a side of the second laser diode chip facing away from the first intermediate carrier. In particular, the first laser diode chip is fastened on the first intermediate carrier and the second laser diode chip is fastened on the second intermediate carrier, in each case by means of a connecting layer.

Upon the mounting of the second laser diode chip on the first intermediate carrier, the second laser diode chip is thus already arranged on the second intermediate carrier. The first intermediate carrier can be used as a common intermediate carrier for the first laser diode chip and the second laser diode chip. In operation of the semiconductor laser arrangement, the generated waste heat of the first laser diode chip and the second laser diode chip can be dissipated via the first intermediate carrier.

According to at least one embodiment of the method, the second laser diode chip, after the arrangement of the second laser diode chip on the intermediate carrier and in particular before the arrangement of the second laser diode chip on the first intermediate carrier, is operated as a test.

At this point in time, the second laser diode chip is thus already arranged on the second intermediate carrier, so that tests can be carried out with an elevated optical load, in particular in comparison to the case of testing a laser diode chip without such an intermediate carrier. The informative power of the testing of the second laser diode chip is thus increased.

If the test of the second laser diode chip was successful, the second laser diode chip can be fastened together with the second intermediate carrier on the first intermediate carrier. In contrast, if the test does not run successfully, the second laser diode chip can be replaced at a comparatively early method stage. The first intermediate carrier is thus only equipped with a second laser diode chip which has the predetermined optical and/or optoelectronic properties.

According to at least one embodiment of the method, the first laser diode chip, after the arrangement of the first laser diode chip on the first intermediate carrier and before the arrangement of the second laser diode chip on the first intermediate carrier, is operated as a test.

The first laser diode chip can thus be put into operation for test purposes before the second laser diode chip is fastened on the first intermediate carrier. It can thus be reliably ensured that the second laser diode chip is only applied to the first intermediate carrier when the first laser diode chip has the predetermined optical and/or optoelectronic properties.

Using the described method, the individual laser diode chips can be subjected to a comparatively strict pretest already at a point in time at which only one laser diode chip is located in each case on the associated intermediate carrier. Laser diode chips which do not fulfill the predetermined optical and/or optoelectronic properties can thus be sorted out at an early method stage, without the remaining laser diode chips, which are functional as such, of the semiconductor laser arrangement to be produced being affected thereby. The discard rate of laser diode chips and the production costs as a whole can thus be reduced.

Of course, the method is also suitable for the production of semiconductor laser arrangements having more than two laser diode chips, for example, having precisely three laser diode chips or more than three laser diode chips.

A separate intermediate carrier is preferably associated with each laser diode chip in this case, wherein in the finished semiconductor laser arrangement, one of the intermediate carriers represents a common intermediate carrier for multiple laser diode chips, in particular all laser diode chips of the semiconductor laser arrangement.

According to at least one embodiment of the method, the first laser diode chip and the second laser diode chip each have a semiconductor body having an active region provided for radiation generation and a substrate, wherein the substrate of the first laser diode chip, upon arrangement of the first laser diode chip on the first intermediate carrier, is arranged on a side of the semiconductor body of the first laser diode chip facing away from the first intermediate carrier. The substrate of the second laser diode chip is, upon fastening of the second laser diode chip on the second intermediate carrier, arranged on a side of the semiconductor body of the second laser diode chip facing toward the second intermediate carrier. In the finished semiconductor laser arrangement, the active regions of the laser diode chips can thus each be arranged on the side of the respective substrate facing toward the first intermediate carrier. The active regions of the individual laser diode chips can thus be located at the same or essentially at the same height, wherein the height denotes the vertical distance from the mounting surface of the first intermediate carrier.

"Essentially" in this context means a deviation of at most 10 μm. The deviation is preferably at most 5 μm.

Furthermore, a semiconductor laser arrangement is specified. The above-described method is particularly suitable for producing the semiconductor laser arrangement. Features described in conjunction with the method can therefore also be used for the semiconductor laser arrangement and vice versa.

According to at least one embodiment of the semiconductor laser arrangement, the semiconductor laser arrangement has a first laser diode chip and a second laser diode chip, wherein the first laser diode chip and the second laser diode chip are arranged on a first intermediate carrier. In particular, the first laser diode chip and the second laser diode chip are fastened adjacent to one another on the first intermediate carrier. The first laser diode chip and the second laser diode chip are thus located on the same side of the intermediate carrier. In particular, the second laser diode chip is arranged on a second intermediate carrier, wherein the second intermediate carrier is arranged on a side of the second laser diode chip facing away from the first intermediate carrier. The second laser diode chip is thus located, seen in a side view of the semiconductor laser arrangement, between the first intermediate carrier and the second intermediate carrier in the vertical direction. In particular, the first laser diode chip is fastened on the first intermediate carrier and the second laser diode chip is fastened on the second intermediate carrier, in each case by means of a connecting layer.

According to at least one embodiment of the semiconductor laser arrangement, the first laser diode chip and the second laser diode chip each have a semiconductor body having an active region provided for generating radiation and a substrate. The substrates are in particular each arranged, seen from the intermediate carrier, on the same side of the active region. In particular, the substrates are preferably arranged on the side of the respective active regions of the laser diode chips facing away from the first intermediate carrier. Waste heat arising in the active regions in operation can thus be dissipated directly via the first intermediate carrier. Heat dissipation via the substrate of the laser diode chips is thus not necessary, but can additionally take place in several exemplary embodiments.

The substrates are in particular already present in the individual laser diode chips at a point in time at which the laser diode chips emerge from a wafer composite due to isolation. The associated intermediate carriers, in contrast, are only attached to the laser diode chips after the isolation into laser diode chips.

A lateral extension n of the second intermediate carrier transversely to a main emission direction of the second laser diode chip is preferably large in relation to a lateral extension of the second laser diode chip. For example, the lateral extension of the second intermediate carrier is at least twice as large, at least three times as large, or at least four times as large as the extension of the second laser diode chip along this direction.

The thermal load of the second laser diode chip can be efficiently buffered during the testing of the second laser diode chip via a comparatively large intermediate carrier.

According to at least one embodiment of the semiconductor laser arrangement, the second laser diode chip is arranged offset transversely to the main emission direction of the second laser diode chip in relation to a the second intermediate carrier. In other words, the second laser diode chip is not located centrally on the second intermediate carrier. For example, a center axis of the second laser diode chip is arranged offset by at least 20% of the transverse extension of the second intermediate carrier in relation to the center axis of the second intermediate carrier.

The first laser diode chip and the second laser diode chip can thus be positioned at a comparatively small distance in relation to one another, without the second intermediate carrier overlapping with the first laser diode chip in a top view of the semiconductor laser arrangement.

According to at least one embodiment of the semiconductor laser arrangement, only the second laser diode chip is arranged between the second intermediate carrier and the first intermediate carrier, in particular seen perpendicularly to the mounting side of the first intermediate carrier. In particular, no further laser diode chip of the semiconductor laser arrangement is located between the first intermediate carrier and the second intermediate carrier, except for the second laser diode chip. Thus, only the second laser diode chip and the connecting layers for fastening the second laser diode chip on the first intermediate carrier and the second intermediate carrier are located between the first intermediate carrier and the second intermediate carrier.

According to at least one embodiment of the semiconductor laser arrangement, the first laser diode chip and the second laser diode chip are arranged between the first intermediate carrier and the second intermediate carrier. In particular, the first laser diode chip is thermally coupled to the second intermediate carrier, for example, via a connecting layer. In this design, the waste heat of the first laser diode chip and the second laser diode chip generated in operation can be spread on opposite sides via the first intermediate carrier or the second intermediate carrier, respectively.

According to at least one embodiment of the semiconductor laser arrangement, a thermal connecting path between the first intermediate carrier and the second intermediate carrier is formed laterally to the first laser diode chip and the second laser diode chip. The waste heat of the first laser diode chip and the second laser diode chip which reaches the second intermediate carrier can be dissipated to the first intermediate carrier via the thermal connecting path. The heat dissipation from the first intermediate carrier can take place via a heatsink or a housing for the semiconductor laser arrangement, for example, on a side of the first intermediate carrier opposite to the mounting side.

According to at least one embodiment of the semiconductor laser arrangement, the first laser diode chip and the second laser diode chip protrude on their emission side in a top view of the semiconductor laser arrangement beyond the first intermediate carrier, for example, by at least 1 μm or at least 5 μm and/or at most 50 μm.

It is thus ensured in a simple manner that the radiation emitted by the first laser diode chip and by the second laser diode chip in operation is not shaded by the first intermediate carrier.

According to at least one embodiment of the semiconductor laser arrangement, the semiconductor laser arrangement has a third laser diode chip, wherein the third laser diode chip is arranged on a third intermediate carrier and is fastened on the first intermediate carrier. The third intermediate carrier can have one or more of the features listed in conjunction with the first intermediate carrier and/or the second intermediate carrier.

For example, the first laser diode chip, the second laser diode chip, and the third laser diode chip are configured to generate radiation having peak wavelengths different from one another, in particular peak wavelengths different from one another in pairs, for example in spectral ranges different from one another in pairs. For example, one of the laser diode chips is configured for generating radiation in the red spectral range, one of the laser diode chips is configured for generating radiation in the green spectral range, and one of the laser diode chips is configured for generating radiation in the blue spectral range.

According to at least one embodiment of the semiconductor laser arrangement, the first laser diode chip is arranged between the second laser diode chip and the third laser diode chip, in particular along the mounting surface and viewed perpendicularly to the main emission direction. A further laser diode chip is thus arranged in each case on both sides of the first laser diode chip on the first intermediate carrier.

Using the described design of semiconductor the laser arrangement, in particular also small center distances between adjacent laser diode chips can be achieved, for example, center distances of at most 1000 μm, at most 500 μm, or at most 300 μm. The center distance is essentially delimited here by the transverse extension of the respective semiconductor chips.

The semiconductor laser arrangement is suitable, for example, as a light source for projectors, in particular projectors having particularly small dimensions and/or for applications in the field of augmented reality.

Further designs and expedient features result from the following description of the exemplary embodiments in conjunction with the figures.

Identical, equivalent, or identically acting elements are provided with the same reference signs in the figures.

The figures are each schematic illustrations and are therefore not necessarily to scale. Rather, relatively small elements and in particular also layer thicknesses can be shown exaggeratedly large for improved illustration and/or for improved understanding.

DETAILED DESCRIPTION

Figure 1A:
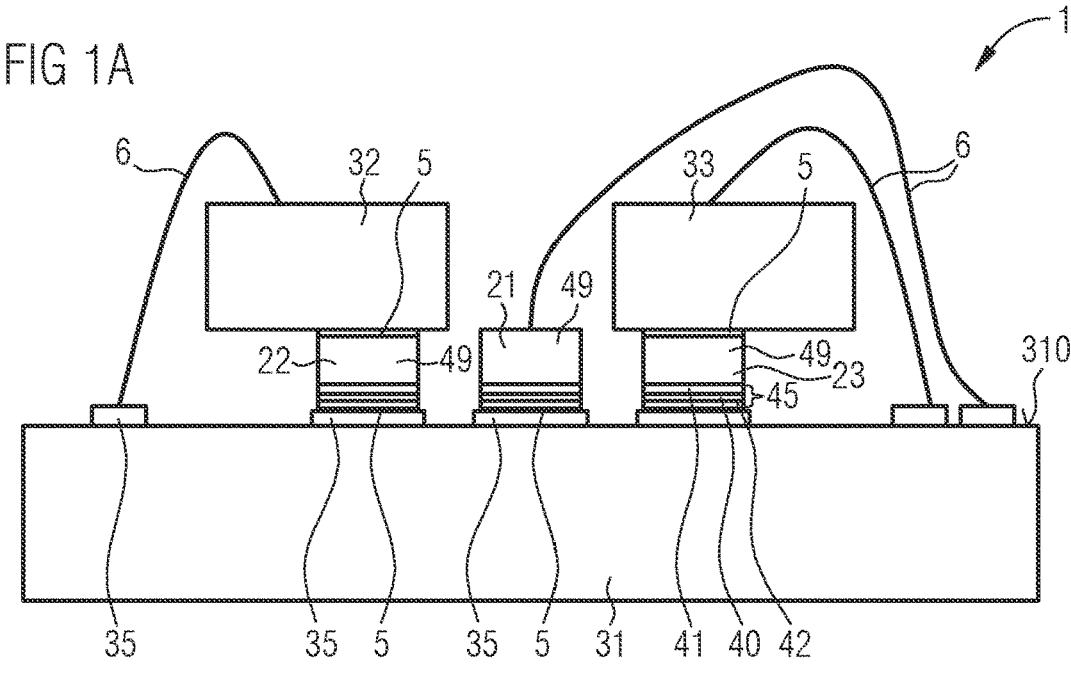
FIGS. 1A, 1B, and 1C show an exemplary embodiment of a semiconductor laser arrangement in a schematic side view (FIG. 1A), schematic top view (FIG. 1B), and on the basis of a perspective illustration of a laser diode chip in FIG. 1C.
Figure 1B:
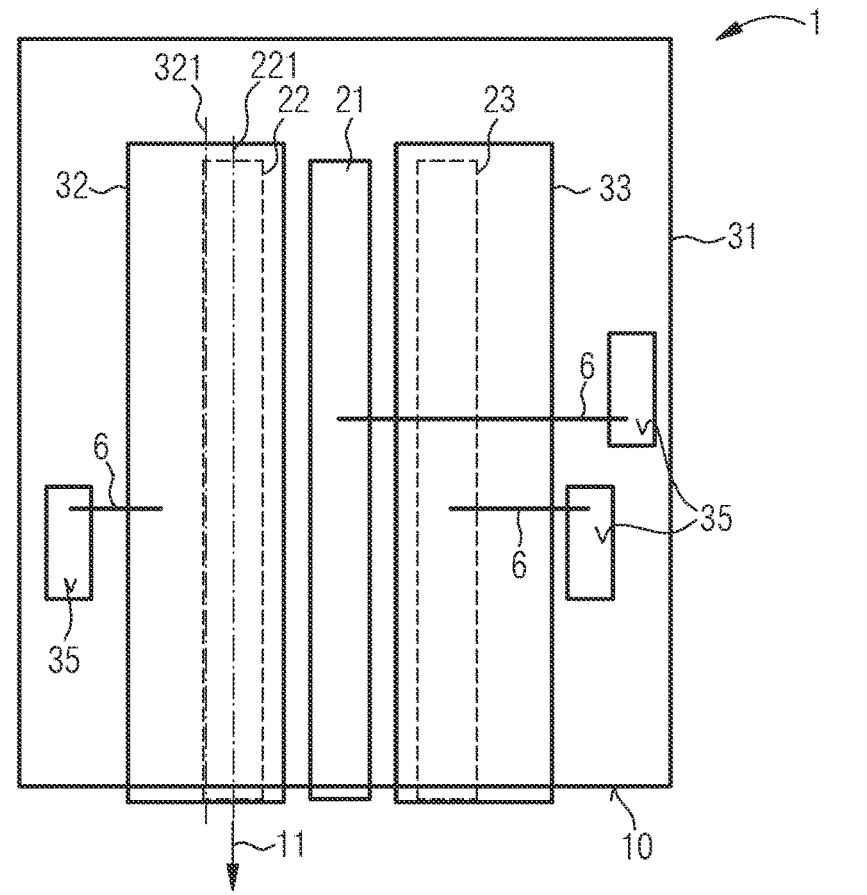
Figure 1C:
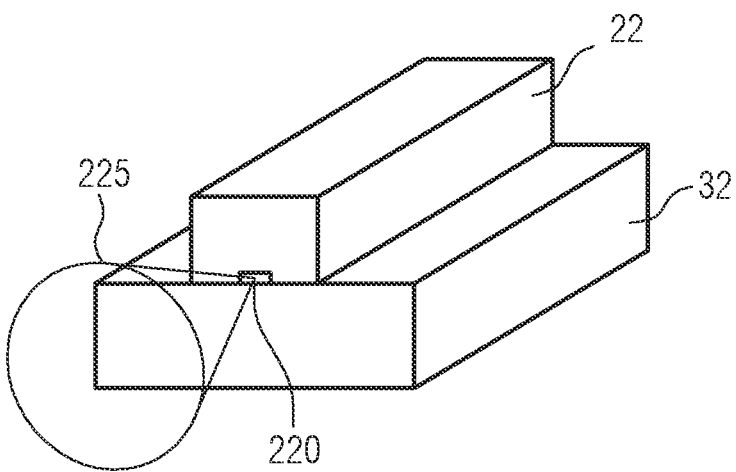

In the exemplary embodiment shown in FIGS. 1A to 1C, the semiconductor laser arrangement 1 has a first laser diode chip 21, a second laser diode chip 22, and a third laser diode chip 23. The first laser diode chip 21 is arranged on a first intermediate carrier 31. The second laser diode chip 22 is arranged on a second intermediate carrier 32. The third laser diode chip 23 is arranged on a third intermediate carrier 33.

Furthermore, the second laser diode chip 22 having the second intermediate carrier 32 and the third laser diode chip 23 having the third intermediate carrier 33 are arranged adjacent to one another on the first intermediate carrier 31, so that the first intermediate carrier 31 forms a common intermediate carrier for the three laser diode chips. In particular, the first laser diode chip 21, the second laser diode chip 22, and the third laser diode chip 23 are arranged adjacent to one another on the same side of the first intermediate carrier 31, in particular a mounting side 310 of the first intermediate carrier, and are fastened directly, thus without further elements located in between, by means of a connecting layer 5 on the first intermediate carrier 31. On the side of the first intermediate carrier 31 opposite to the mounting side 310, the semiconductor laser arrangement 1 can be mounted, for example, on a heatsink or a housing part for the semiconductor laser arrangement.

The second intermediate carrier 32 is arranged on a side of the second laser diode chip 22 facing away from the first intermediate carrier 31. Similarly, the third intermediate carrier 33 is arranged on a side of the third semiconductor chip 23 facing away from the first intermediate carrier 31. The mechanically stable connection between the laser diode chips 21, 22, 23 and the intermediate carriers 31, 32, 33 is produced in each case via a connecting layer 5, for example, a solder layer.

The laser diode chips 21, 22, 23 each have a semiconductor body having a semiconductor layer sequence, wherein the semiconductor layer sequence has a first semiconductor layer of a first conduction type, and a second semiconductor layer 42 of a second conduction type different from the first conduction type. For example, the first semiconductor layer 41 is n-conductive and the second semiconductor layer 42 is p-conductive or vice versa. The active region 40 is arranged between the first semiconductor layer 41 and the second semiconductor layer 42. The first semiconductor layer 41, the second semiconductor layer 42, and the active region 40 are typically made multilayered. This is not shown for simplified illustration.

The laser diode chips 21, 22, 23 furthermore each have a substrate 49, on which the semiconductor body 45 is arranged. The substrate 49 is a growth substrate for the epitaxial deposition of the semiconductor layers of the semiconductor body 45 or a substrate different from the growth substrate.

For example, the active region 40 of each of the laser diode chips 21, 22, 23 has a compound semiconductor material, in particular a III-V compound semiconductor material.

III-V compound semiconductor materials are particularly suitable for radiation generation in the ultraviolet ($Al_x In_y Ga_{1-x-y} N$) via the visible ($Al_x In_y Ga_{1-x-y} N$, in particular for blue to green radiation, or $Al_x In_y Ga_{1-x-y} P$, in particular for yellow to red radiation) up into the infrared ($Al_x In_y Ga_{1-x-y} As$) spectral range. In this case $0 \leq x \leq 1$, $0 \leq y \leq 1$, and $x+y \leq 1$, applies in each case, in particular with $x \neq 1$, $y \neq 1$, $x \neq 0$, and/or $y \neq 0$. Using III-V compound semiconductor materials, in particular from the mentioned material systems, high internal quantum efficiencies can furthermore be achieved in the radiation generation.

For example, the first laser diode chip 21 emits in the green spectral range, the second laser diode chip 22 emits in the red spectral range, and the third laser diode chip 23 emits in the blue spectral range.

In FIG. 1C, the second laser diode chip 22 is shown on the second intermediate carrier 32 in a perspective illustration as an example. The second laser diode chip 22 is formed as an edge-emitting laser diode chip, as are the other laser diode chips. An emission 225 takes place along a main emission direction 11 from an emission region 220 of the laser diode chip 22. The lateral structuring of the second laser diode chip 22 for the lateral waveguiding is not explicitly shown for simplified illustration. For example, the laser diode chips 21, 22, 23 each have a ridge waveguide.

The first intermediate carrier 31 expediently comprises a material having high thermal conductivity, for example, SiC, AlN, or CuW. The thermal conductivity is preferably at least 100 W/(m*K). The generated waste heat can thus be dissipated efficiently via the first intermediate carrier 31.

In principle, the same materials are suitable for the second intermediate carrier 32 and the third intermediate carrier 33 as for the first intermediate carrier 31. Since the second intermediate carrier 32 and the third intermediate carrier 33 do not necessarily have to be used for heat dissipation in the finished semiconductor laser arrangement 1, however, a more cost-effective material can possibly also be used for the second intermediate carrier 32 and the third intermediate carrier 33, for example, silicon or germanium.

Figure 3:
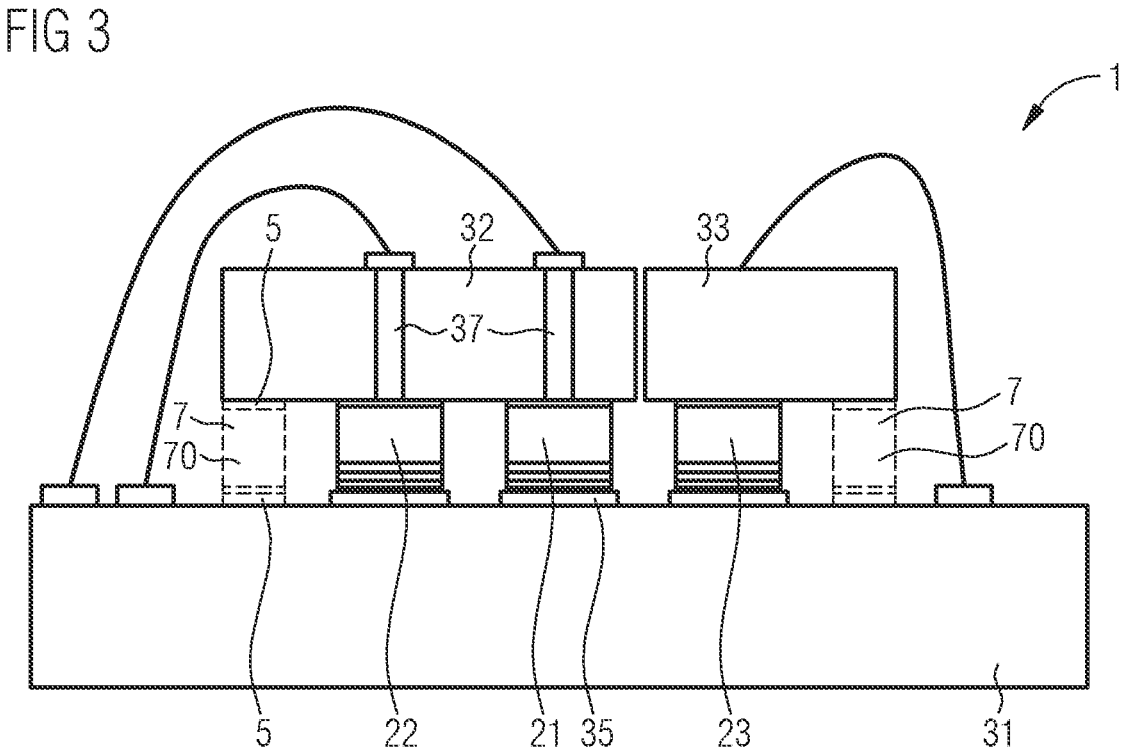
FIG. 3 shows an exemplary embodiment of a semiconductor laser arrangement in a schematic sectional view.

The second intermediate carrier 32 and the third intermediate carrier 33 can, however, as described in conjunction with FIG. 3, also be thermally coupled to the first intermediate carrier 31, so that a heat dissipation from the laser diode chips 21, 22, 23 in operation of the semiconductor laser arrangement can also take place via these intermediate carriers 32, 33.

The electrical contacting of the laser diode chips 21, 22, 23 on the side facing away from the first intermediate carrier 31 takes place, for example, via connecting lines 6, such as bond wires, which are led to terminal areas 35 of the first intermediate carrier. On the side facing toward the first intermediate carrier 31, the electrical contacting can take place via the connecting layer 5 to the associated terminal areas 35 of the first intermediate carrier 31.

On an emission side 10 of the semiconductor laser arrangement 1, the first laser diode chip 21, the second laser diode chip 22, and the third laser diode chip 23 protrude beyond the first intermediate carrier 31 as seen in a top view of the semiconductor laser arrangement. In spite of the divergence of the emission 25 shown in FIG. 1C in the vertical direction, thus perpendicularly to the mounting side 310 of the first intermediate carrier 31, it is thus possible to prevent the emitted radiation from being incident on the first intermediate carrier 31. For example, the laser diode chips 21, 22, and 23 protrude a few micrometers beyond the first intermediate carrier 31.

As shown in the top view of FIG. 1B, a center axis 221 of the second laser diode chip 22 is arranged offset in a direction perpendicular to the main emission direction 11 in relation to a center axis 321 of the second intermediate carrier 32. A positioning having a comparatively small center distance can thus be achieved between the first laser diode chip 21 and the second laser diode chip 22, wherein at the same time the transverse extension of the second intermediate carrier 32 can be comparatively large in relation to the transverse extension of the second semiconductor chip 22.

Of course, the semiconductor laser arrangement can also only have two laser diode chips or more than three laser diode chips, wherein preferably the number of the intermediate carriers is equal to the number of the laser diode chips.

Figure 2A:
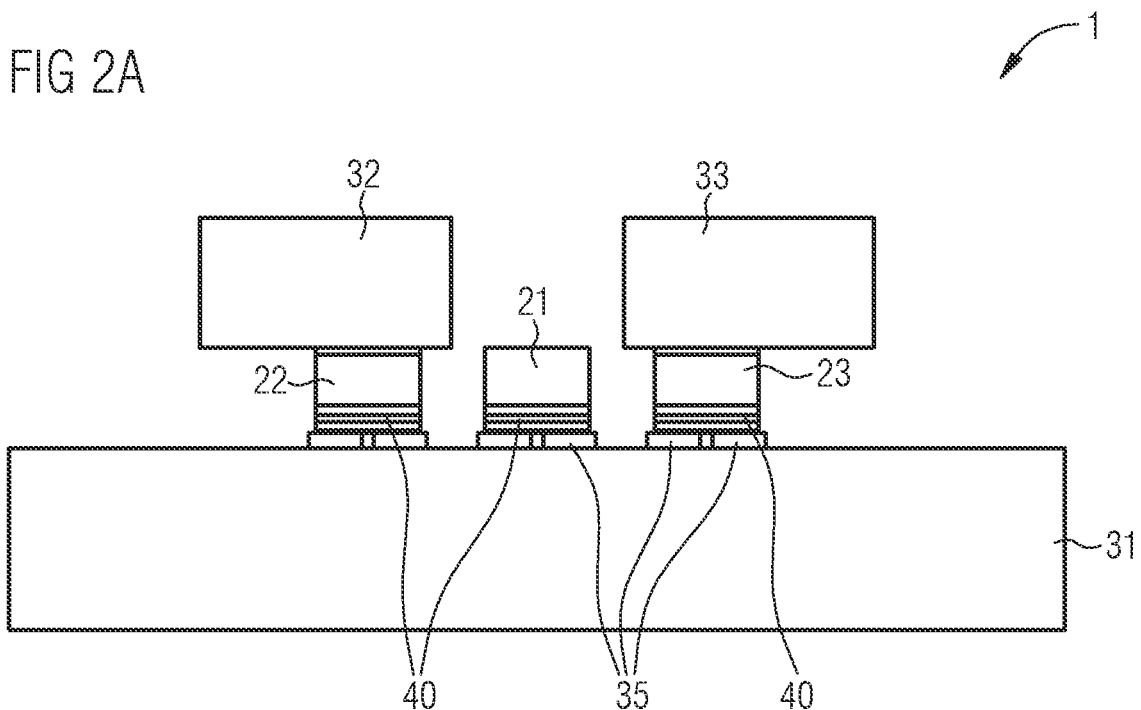
FIGS. 2A and 2B show an exemplary embodiment of a semiconductor laser arrangement on the basis of a schematic side view of the semiconductor laser arrangement in FIG. 2A and a schematic sectional view of a laser diode chip suitable for the semiconductor laser arrangement in FIG. 2B.
Figure 2B:
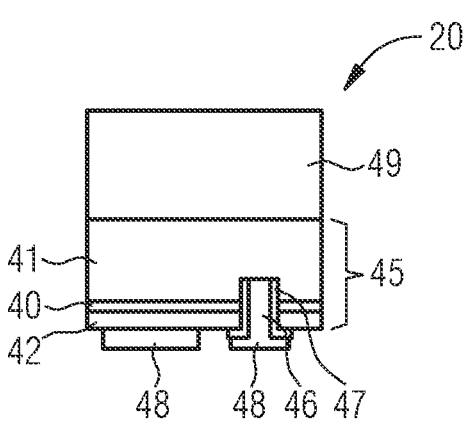

The exemplary embodiment illustrated in FIGS. 2A and 2B essentially corresponds to the exemplary embodiment described in conjunction with FIGS. 1A to 1C. In contrast thereto, however, the electrical contacting of the laser diode chips 21, 22, 23 does not take place via connecting lines 6.

FIG. 2B shows a design of a suitable laser diode chip 20. This design can be used for one or more of the laser diode chips 21, 22, 23 or also all laser diode chips of the semiconductor laser arrangement 1. In the laser diode chip 20, both contacts 48 of the laser diode chip 20 provided for the electrical contacting are arranged on the side of the semiconductor body 25 facing away from the substrate 49 and are accessible for electrical contacting. The semiconductor body 45 has a recess 46, in which one of the contacts 48 is electrically conductively connected to the first semiconductor layer 41. The further contact 48 is electrically conductively connected to the second semiconductor layer 42, so that by applying an electrical voltage between the contacts 48, charge carriers can be injected from opposite sides into the active region 40 and recombine there with emission of radiation. To avoid an electrical short circuit, the recess 46 can be lined with an insulating layer 47.

The exemplary embodiment shown in FIG. 3 essentially corresponds to the exemplary embodiment described in conjunction with FIG. 1. In contrast thereto, the first laser diode chip 21 and the second laser diode chip 22 are arranged between the first intermediate carrier 31 and the second intermediate carrier 32. The second intermediate carrier 32 can thus, in addition to the second laser diode chip 22, also thermally connect the first laser diode chip 21 on the side facing away from the first intermediate carrier 31.

The electrical contacting of the first laser diode chip 21 and the second laser diode chip 22 can take place in each case, for example, via a through contact 37 through the second intermediate carrier 32. However, other types of electrical contacting are also possible, for example, the first laser diode chip 21 and the second laser diode chip 22 can be electrically contacted jointly on the side facing away from the first intermediate carrier 31, in particular when the first laser diode chip 31 and the second laser diode chip 32 are assigned terminal areas 35 separate from one another on the side facing toward the first intermediate carrier 31.

A thermal connecting path 7 is optionally formed laterally to the first laser diode chip 21 and the second laser diode chip 22 between the second intermediate carrier 32 and the first intermediate carrier 31. For example, the thermal connecting path 7 is formed by a volume body 70, which, like the laser diode chips 21, 22, 23, is connected in a mechanically stable and thermally conductive manner via a connecting layer 5 to the first intermediate carrier 31 and the second intermediate carrier 32. The volume body 70 thus essentially has the same thickness, thus the same vertical extension, as the laser diode chips 21, 22, 23, for example with a deviation of at most 10 µm or at most 5 µm.

For example, the materials mentioned in conjunction with the first intermediate carrier 31 or the second intermediate carrier 32 are suitable for the volume body 70.

The laser diode chips 21 and 22 are thus additionally cooled via the second intermediate carrier 32 on the side facing away from the first intermediate carrier 31, wherein the heat can be discharged via the thermal connecting path 7 to the first intermediate carrier 31. In a similar manner, the third intermediate carrier 33 can also optionally be provided with such a thermal connecting path 7.

Such a thermal connecting path 7 can also be used in the exemplary embodiments described in conjunction with FIGS. 1A to 1C or in conjunction with FIGS. 2A and 2B.

A method for producing a semiconductor laser arrangement is described by way of example in FIGS. 4A to 4D, in which the produced semiconductor laser arrangement 1 is embodied as described in conjunction with FIGS. 1A to 1C.

However, the method is also suitable for the production of a different semiconductor laser arrangement, in particular according to the other exemplary embodiments.

Figure 4A:
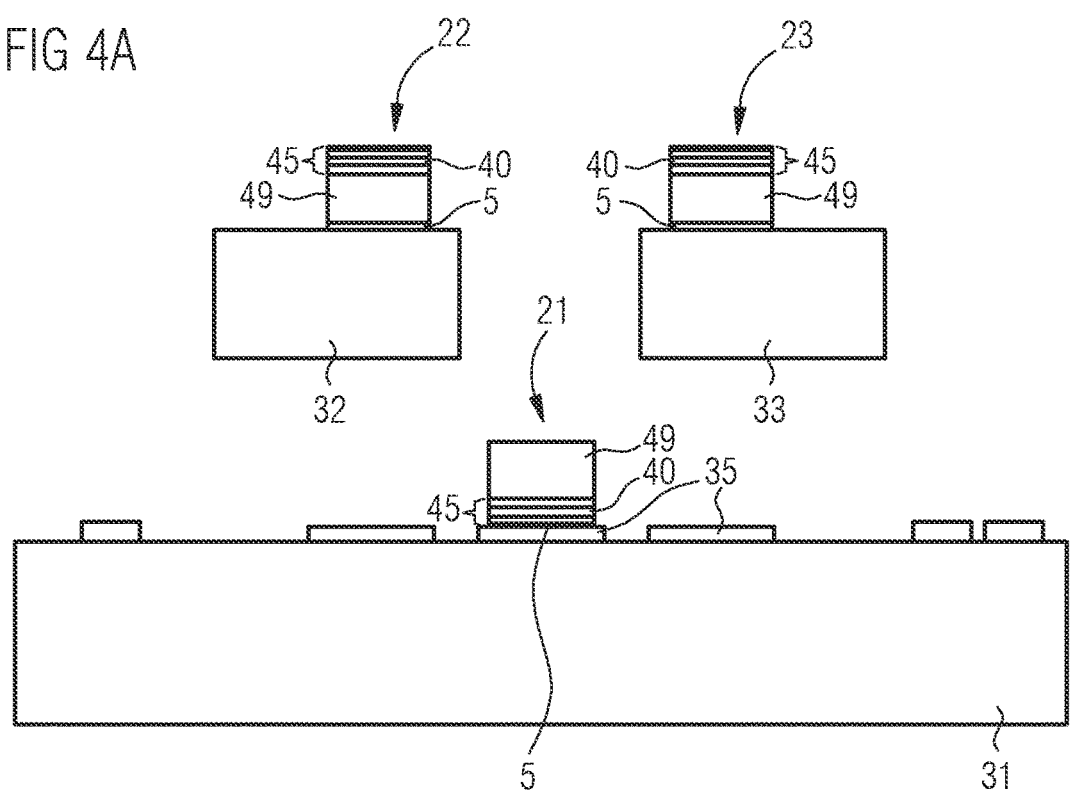
FIGS. 4A to 4D show an exemplary embodiment of a method for producing a semiconductor laser arrangement on the basis of intermediate steps each shown schematically in a side view.

As shown in FIG. 4A, a first laser diode chip 21 is arranged on a first intermediate carrier 31, a second laser diode chip 22 is arranged on a second intermediate carrier 32, and a third laser diode chip 23 is arranged on a third intermediate carrier 33 and in particular fastened in each case by means of a connecting layer 5 on the assigned intermediate carrier. The number of the intermediate carriers 31, 32, 33 thus corresponds to the number of laser diode chips 21, 22, 23 present in the semiconductor laser arrangement to be produced.

The active region 40 of the first laser diode chip 21 is located in this case between the substrate 49 and the first intermediate carrier. In contrast thereto, the active region 40 of the second laser diode chip 22 and of the third laser diode chip 23 are each located on the side of the associated substrate 49 facing away from the associated second intermediate carrier 32 or the third intermediate carrier 33, respectively.

Figure 4B:
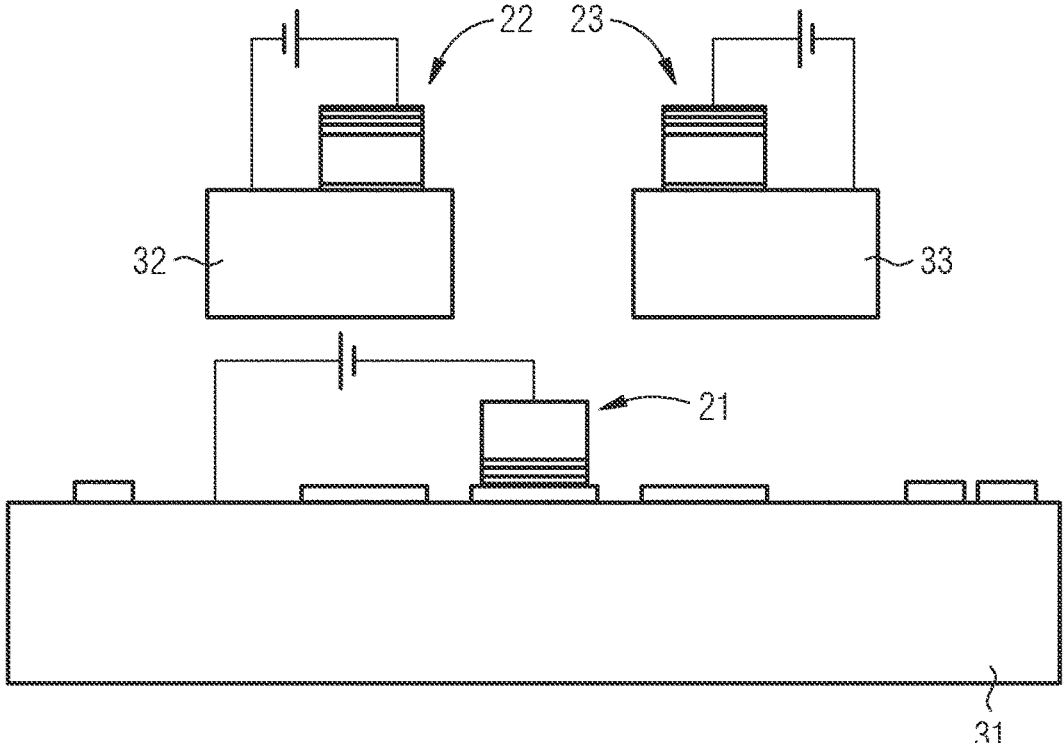

The first laser diode chip 21, the second laser diode chip 22, and the third laser diode chip 23 are then electrically contacted as a test, as shown in FIG. 4B, so that the optical and optoelectronic properties of the laser diode chips 21, 22, 23 can be tested.

For example, parameters such as the peak wavelengths or the spectral breadth of the emitted radiation, the quantum efficiency, or the laser threshold can be ascertained. At this point in time, the laser diode chips are already each on one of the intermediate carriers 31, 32, 33, so that this test can be carried out at comparatively high load. Moreover, an efficient thermal connection to the respective intermediate carrier can take place via the connecting layer 5, such as a solder. The waste heat generated in the active regions 40 of the second laser diode chip 22 and the third laser diode chip 23 during the test can be dissipated via the respective substrate 49. The thermal connection is thus less efficient than for the first laser diode chip 31, but is adequate to be able to subject the second laser diode chip 22 and the third laser diode chip 23 to an informative test.

Figure 4C:
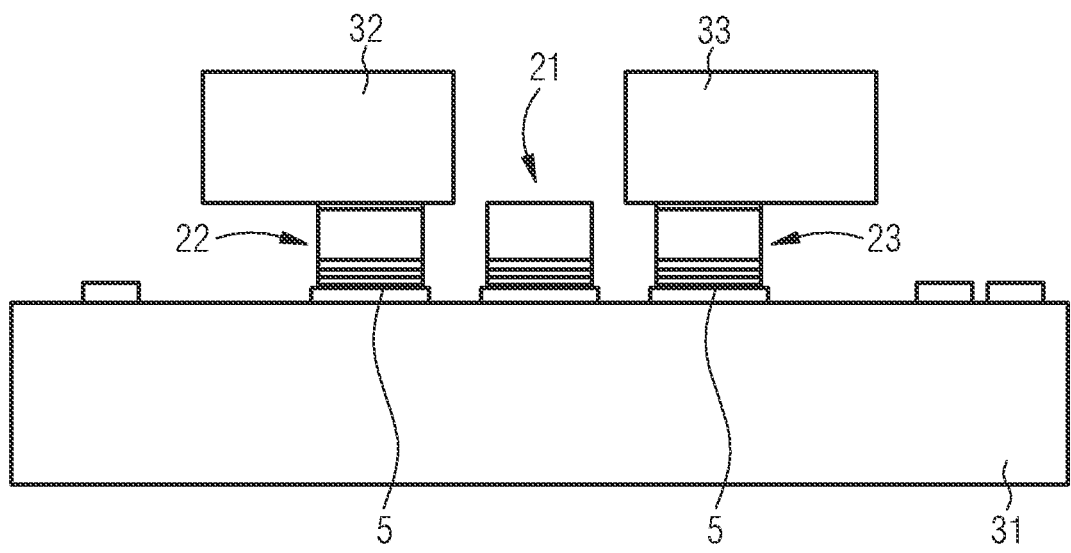

After a successful course of the test of the individual laser diode chips, the second laser diode chip 22 and the third laser diode chip 23 having the associated second or third intermediate carrier, respectively, can be fastened on the first intermediate carrier 31 (FIG. 4C). The second intermediate carrier 32 and the third intermediate carrier 33 are each located on the side of the second and third laser diode chip facing away from the first intermediate carrier 31. With respect to the first intermediate carrier 31, the active regions 40 are each located on the side of the respective substrate 49 facing toward the first intermediate carrier 31, so that the active regions 40 are each at least approximately located at the same distance from the mounting side 310 of the first intermediate carrier 31. The intermediate carriers provided in addition to the first intermediate carrier 31 thus have no effect on the vertical distance of the active regions from the mounting side of the first intermediate carrier.

Figure 4D:
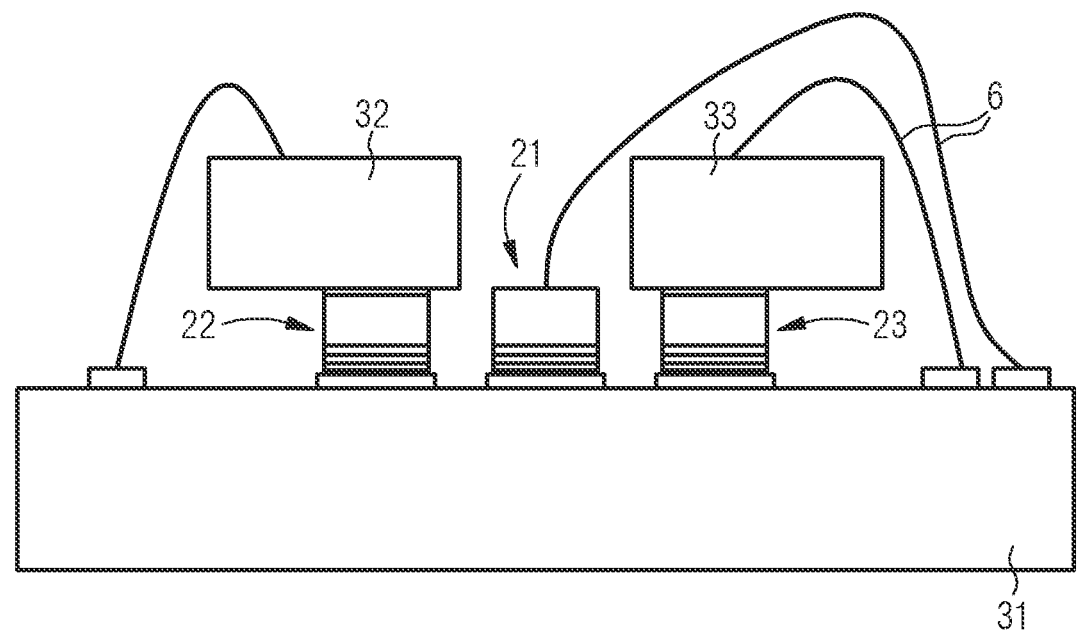

Finally, the electrical contacting of the laser diode chips 21, 22, 23 can be carried out if necessary by means of connecting lines 6 (FIG. 4D).

Using the described method, nonfunctional laser diode chips can be subjected to an informative operating test at a comparatively early method stage and sorted out if necessary. In particular, this can take place even before further laser diode chips are fastened on the same intermediate carrier. It is thus possible to avoid one laser diode chip or also multiple laser diode chips that are functional as such from having to be discarded if one of the laser diode chips of the semiconductor laser arrangement to be produced does not fulfill the predetermined properties.

In particular, is suitable for producing the method semiconductor laser arrangements in which multiple semiconductor lasers, which differ with respect to their peak wavelengths from one another and therefore have different material compositions or are even formed from material systems different from one another, are required, for example for a full-color projection.

This patent application claims the priority of German patent application 10 2020 111 394.3, the contents of the disclosure of which is hereby incorporated by reference.

The invention is not restricted by the description on the basis of the exemplary embodiments. Rather, the invention comprises each novel feature and each combination of features, which includes in particular each combination of features in the claims, even if this feature or this combination is not explicitly specified itself in the claims or the exemplary embodiments.

The invention claimed is:

1. A method for producing a semiconductor laser arrangement having the following steps:

a) arranging a first laser diode chip on a first intermediate heat dissipation carrier such that the first laser diode chip is arranged between a first laser diode chip substrate of the first laser diode chip and the first intermediate heat dissipation carrier;

b) arranging a second laser diode chip on a second intermediate heat dissipation carrier such that a second laser diode chip substrate of the second laser diode chip is arranged between the second laser diode chip and the second intermediate heat dissipation carrier; and c) arranging the second laser diode chip having the second intermediate heat dissipation carrier on the first intermediate heat dissipation carrier, wherein the second intermediate heat dissipation carrier is arranged on a side of the second laser diode chip facing away from the first intermediate heat dissipation carrier, wherein the first laser diode chip is fastened on the first intermediate heat dissipation carrier but not fastened on the second intermediate carrier and the second laser diode chip is fastened on the second intermediate heat dissipation carrier in each case by a connecting layer.

2. The method as claimed in claim 1, wherein the second laser diode chip is operated as a test after step b) and before step c).

3. The method as claimed in claim 1, wherein the first laser diode chip is operated as a test after step a) and before step c).

4. The method as claimed in claim 1, wherein the first laser diode chip comprises a first semiconductor body having a first active region provided for first radiation generation and the first laser diode chip substrate and the second laser diode chip comprises a second semiconductor body having a second active region provided for second radiation generation and the second laser diode chip substrate, wherein the first laser diode chip substrate of the first laser diode chip is arranged in step a) on a side of the first semiconductor body of the first laser diode chip facing away from the first intermediate heat dissipation carrier and the second laser diode chip substrate of the second laser diode chip is arranged in step b) on a side of the second semiconductor body of the second laser diode chip facing toward the second intermediate heat dissipation carrier.

5. The method as claimed in claim 1, wherein the first intermediate carrier, the first intermediate carrier, or both comprises AlN, SiC, CuW.

6. A semiconductor laser arrangement having a first laser diode chip and a second laser diode chip, wherein the first laser diode chip and the second laser diode chip are arranged on a first intermediate heat dissipation carrier such that the first laser diode chip is arranged between a first laser diode chip substrate of the first laser diode chip and the first intermediate heat dissipation carrier;

the second laser diode chip is arranged on a second intermediate heat dissipation carrier, wherein a second laser diode chip substrate of the second laser diode chip is arranged between the second laser diode chip and the second intermediate heat dissipation carrier and the second intermediate heat dissipation carrier is arranged on a side of the second laser diode chip facing away from the first intermediate heat dissipation carrier; and the first laser diode chip is fastened on the first intermediate heat dissipation carrier but not fastened on the second intermediate carrier and the second laser diode chip is fastened on the second intermediate heat dissipation carrier in each case by a connecting layer.

7. The semiconductor laser arrangement as claimed in claim 6, wherein the first laser diode chip comprises a first semiconductor body having a first active region provided for first radiation generation and the first laser diode chip substrate and the second laser diode chip comprises a second semiconductor body having a second active region provided for second radiation generation and the second laser diode chip substrate, wherein the first laser diode chip substrate and the second laser diode chip substrate are each arranged on the same side of the first active region and the second active region seen from the first intermediate heat dissipation carrier.

8. The semiconductor laser arrangement as claimed in claim 6, wherein the second laser diode chip is arranged offset transversely to a main emission direction of the second laser diode chip in relation to a center axis of the second intermediate heat dissipation carrier.

9. The semiconductor laser arrangement as claimed in claim 6, wherein only the second laser diode chip is arranged between the second intermediate heat dissipation carrier and the first intermediate heat dissipation carrier.

10. The semiconductor laser arrangement as claimed in claim 6, wherein a thermal connecting path is formed between the first intermediate heat dissipation carrier and the second intermediate heat dissipation carrier laterally to the first laser diode chip and the second laser diode chip.

11. The semiconductor laser arrangement as claimed in claim 6, wherein the first laser diode chip and the second laser diode chip protrude beyond the first intermediate heat dissipation carrier on their emission side in a top view of the semiconductor laser arrangement.

12. The semiconductor laser arrangement as claimed in claim 6, wherein the semiconductor laser arrangement has a third laser diode chip, which is arranged on a third intermediate heat dissipation carrier and on the first intermediate heat dissipation carrier.

13. The semiconductor laser arrangement as claimed in claim 12, wherein the first laser diode chip is arranged between the second laser diode chip and the third laser diode chip.

14. The semiconductor laser arrangement as claimed in claim 12, wherein the first laser diode chip, the second laser diode chip, and the third laser diode chip are configured for generating radiation having peak wavelengths different from one another.

15. The semiconductor laser arrangement as claimed in claim 6, which is produced by a) arranging a first laser diode chip on a first intermediate heat dissipation carrier such that a first laser diode chip substrate of the first laser diode chip is arranged between the first laser diode chip and the first intermediate heat dissipation carrier;

b) arranging a second laser diode chip on a second intermediate heat dissipation carrier such that a second laser diode chip substrate of the second laser diode chip is arranged between the second laser diode chip and the second intermediate heat dissipation carrier; and c) arranging the second laser diode chip having the second intermediate heat dissipation carrier on the first intermediate heat dissipation carrier, wherein the second intermediate heat dissipation carrier is arranged on a side of the second laser diode chip facing away from the first intermediate heat dissipation carrier, wherein the first laser diode chip is fastened on the first intermediate heat dissipation carrier but not fastened on the second intermediate carrier and the second laser diode chip is fastened on the second intermediate heat dissipation carrier in each case by a connecting layer.

16. The semiconductor laser arrangement as claimed in claim 6, wherein the first intermediate carrier, the first intermediate carrier, or both comprises AlN, SiC, CuW.

* * * * *